United States Patent
Miglani

(10) Patent No.: US 9,035,813 B2
(45) Date of Patent: May 19, 2015

(54) TECHNIQUE FOR EXCESS LOOP DELAY COMPENSATION IN DELTA-SIGMA MODULATORS

(71) Applicant: Texas Instruments Incorporated, Dallas, TX (US)

(72) Inventor: Eeshan Miglani, Chhindwara (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/038,350

(22) Filed: Sep. 26, 2013

(65) Prior Publication Data

US 2015/0061907 A1  Mar. 5, 2015

(30) Foreign Application Priority Data

Sep. 3, 2013  (IN) .............................. 3953/CHE/2013

(51) Int. Cl.
*H03M 3/00* (2006.01)
(52) U.S. Cl.
CPC . *H03M 3/39* (2013.01); *H03M 3/30* (2013.01)

(58) Field of Classification Search
CPC ....................................................... H03M 3/424
USPC ........................................................... 341/143
See application file for complete search history.

(56) References Cited

U.S. PATENT DOCUMENTS

| 6,642,873 B1 * | 11/2003 | Kuang | 341/143 |
| 7,298,306 B2 * | 11/2007 | Melanson | 341/143 |
| 7,453,381 B2 * | 11/2008 | Doerrer et al. | 341/143 |
| 7,535,392 B2 * | 5/2009 | Weng et al. | 341/143 |

* cited by examiner

*Primary Examiner* — Khai M Nguyen
(74) *Attorney, Agent, or Firm* — John R. Pessetto; Frank D. Cimino

(57) ABSTRACT

A technique for excess loop delay compensation in delta sigma modulator. The delta sigma modulator includes a loop filter. The loop filter receives an analog input signal and an output of a digital to analog converter. A comparator receives an output of the loop filter and generates a digital output signal. A reference select logic unit receives the digital output signal as a feedback and generates one or more switching signals. One or more switches are coupled to the comparator and each switch receives a pre-computed reference voltage. The one or more switches are activated by the one or more switching signals in response to the digital output signal.

22 Claims, 5 Drawing Sheets

US 9,035,813 B2

TECHNIQUE FOR EXCESS LOOP DELAY COMPENSATION IN DELTA-SIGMA MODULATORS

TECHNICAL FIELD

The disclosure relates to analog-to-digital converters (ADCs) and more particularly to Delta Sigma Modulator (DSM).

BACKGROUND

Most electrical systems are digital today and hence require analog-to-digital converters (ADCs) to interface to the outside world. The outside world can either be real world signals such as temperature, pressure, voice, etc., or modulated carriers transmitting information over some medium (analog or digital communication). For all applications, energy efficiency is extremely important and more so for battery operated systems.

Delta sigma architectures are widely used for high resolution, low speed ADCs as well as for medium resolution, high speed ADCs. The continuous time delta sigma modulators (CTDSM) for low speed applications require lower number of bits and are very popular because of their simple design and low power. High speed applications require CTDSM with very high sampling rate. However, the CTDSM loop contains filters, one or more comparators and one or more feedback DACs (digital to analog converters) which contribute to some delay in the loop which is termed as excess loop delay. The excess loop delay modifies the transfer function of the loop thus degrading the stability and signal to noise ratio of the CTDSMs. Thus, for high speed applications, a CTDSM is required which can support high sampling rate.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides a delta sigma modulator. The delta sigma modulator includes a loop filter. The loop filter receives an analog input signal and an output of a digital to analog converter. A comparator receives an output of the loop filter and generates a digital output signal. A reference select logic unit receives the digital output signal as a feedback and generates one or more switching signals. One or more switches are coupled to the comparator and each switch of the one or more switches receives a pre-computed reference voltage. The one or more switches are activated by the one or more switching signals in response to the digital output signal.

An embodiment provides a delta sigma modulator. The delta sigma modulator includes a loop filter. The loop filter receives an analog input signal and an output of a digital to analog converter. A plurality of comparators receives an output of the loop filter and each comparator of the plurality of comparators generates a digital output signal. A reference select logic unit receives the digital output signal from each comparator as a feedback and generates a plurality of switching signals. A switching unit is coupled to the plurality of comparators and receives a plurality of pre-computed reference voltages. The switching unit comprising a plurality of switches that are activated by the one or more switching signals in response to the digital output signal from each comparator. Each switch of the plurality of switches receives a pre-computed reference voltage of the plurality of pre-computed reference voltages.

Another embodiment provides a method of generating a digital output signal in a delta sigma modulator responsive to an analog input signal. A first analog signal and the analog input signal are processed to generate a first output signal. The first output signal is compared with a pre-computed reference voltage to generate a digital output signal. The pre-computed reference voltage is selected of a plurality of pre-computed reference voltages responsive to the digital output signal.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
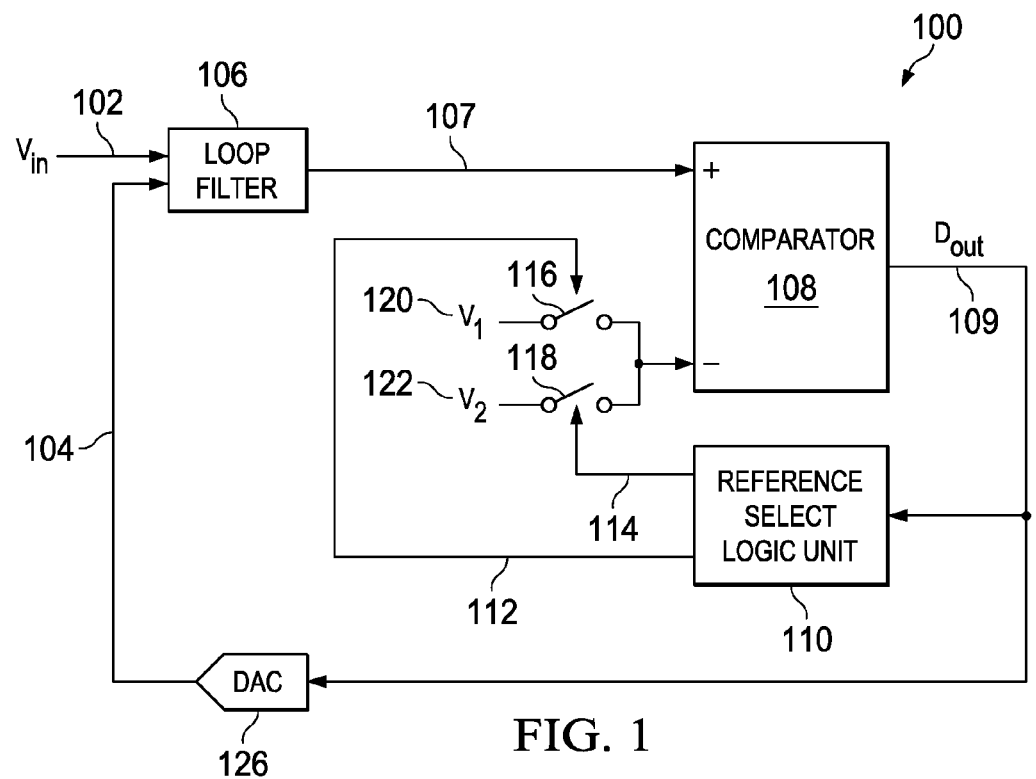
FIG. 1 illustrates architecture of a Delta Sigma modulator, according to an embodiment.

FIG. 1 illustrates architecture of a delta sigma modulator 100, according to an embodiment. The delta sigma modulator 100 includes a loop filter 106 that receives an analog input signal ($V_{in}$) 102 and a first analog signal 104. The first analog signal 104 is an output of a digital to analog converter 126. In one embodiment, the loop filter 106 receives a plurality of first analog signal from a plurality of digital to analog converters. In an embodiment, the loop filter 106 includes one or more integrators coupled to one or more summation devices and at least one summation device of the one or more summation devices receives a first analog signal from a digital to analog converter of the plurality of digital to analog converters. In another embodiment, the loop filter 106 includes one or more resonators coupled to one or more summation devices and at least one summation device of the one or more summation devices receives a first analog signal from a digital to analog converter of the plurality of digital to analog converters. An output of the loop filter 106 is a first output signal 107. The first output signal 107 is provided to the comparator 108. The comparator 108 generates a digital output signal ($D_{out}$) 109. The digital output signal ($D_{out}$) 109 is provided to a reference select logic unit 110 as a feedback. The reference select logic unit 110 generates one or more switching signals such as switching signals 112 and 114. The delta sigma modulator 100 includes one or more switches such as switches 116 and 118. The switch 116 receives a pre-computed reference voltage (V1) 120 and switch 118 receives a pre-computed reference voltage (V2) 122. The one or more switches 116 and 118 are coupled to the comparator 108. The one or more switches 116 and 118 are activated by the one or more switching signals 112 and 114 respectively. In one embodiment, a combination of switches is used to activate a switch. The digital to analog converter 126 receives the digital output signal ($D_{out}$) 109 as a feedback signal and generates the first analog signal 104. The delta sigma modulator 100 may include one or more additional components known to those skilled in the relevant art and are not discussed here for simplicity of the description.

The operation of the delta sigma modulator 100 illustrated in FIG. 1 is explained now. The analog input signal ($V_{in}$) 102 is a voltage signal. In some embodiments, the analog input signal ($V_{in}$) 102 is either a current signal or a charge signal. In some embodiments, the analog input signal ($V_{in}$) 102 is at least one of a single ended signal and a differential signal. The loop filter 106 process the analog input signal ($V_{in}$) 102 and the first analog signal 104. The processing by loop filter 106 includes the following, but not limited to, comparing, subtracting, amplifying, and filtering the input signals. The loop filter 106 generates the first output signal 107. The comparator 108 compares the first output signal 107 and a pre-computed reference voltage of the one or more pre-computed reference voltages received through the one or more switches 116 and 118. The comparator 108 generates a digital output signal ($D_{out}$) 109. The digital output signal ($D_{out}$) 109 is provided to the reference select logic unit 110. The reference select logic unit 110 is one of the following, but not limited to, a logic-gate combination unit, a flip-flop unit, and a multiplexer unit. Based on the digital output signal ($D_{out}$) 109, the reference select logic unit 110 generates switching signals 112 and 114. The switching signals 112 and 114 activate one or more of the switches 116 and 118. As illustrated, the switching signal 112 activates switch 116 and the switching signal 114 activates switch 118. The switch 112 receives the pre-computed reference voltage (V1) 120 and switch 118 receives a pre-computed reference voltage (V2) 122. When switch 116 is activated by the reference select logic unit 110, the reference voltage (V1) 120 is provided to the comparator 108. When switch 118 is activated by the reference select logic unit 110, the pre-computed reference voltage (V2) 122 is provided to the comparator 108.

The one or more pre-computed reference voltages V1 and V2 are calculated and stored in the delta sigma modulator 100. In one embodiment, the pre-computed reference voltages are fed to the delta sigma modulator 100 when the system comprising the delta sigma modulator 100 is initiated or reset. The values of pre-computed reference voltages is such that a sampling frequency of the delta sigma modulator 100 is increased, leading to a correspondingly higher oversampling ratio (OSR) and a significantly higher resolution. Oversampling ratio (OSR) is the ratio of actual sampling frequency of a signal to Nyquist sampling frequency of the signal. In one embodiment, the pre-computed reference voltage is computed using the following:

$$V_{ref} = \text{Default reference voltage} + K_o * \text{Analog Equivalent of } D_{out}$$

where $K_o$ is multiplication factor and the default reference voltage is predefined for a comparator. Also, the multiplication factor is predefined for a sigma delta modulator. Analog equivalent of $D_{out}$ is the corresponding analog value of the digital output signal $D_{out}$.

In one embodiment, the pre-computed reference voltage is calculated from at least one of a default reference voltage of the comparator, a multiplication factor and the digital output signal. The reference select logic unit 110 and the one or more switches 116, 118 provide fast feedback to the comparator 108 and hence this path is termed as direct path. The direct path results in higher sampling frequency of the delta sigma modulator 100 as pre-computed reference voltages are used and the reference voltages are not calculated in real time.

Figure 2:
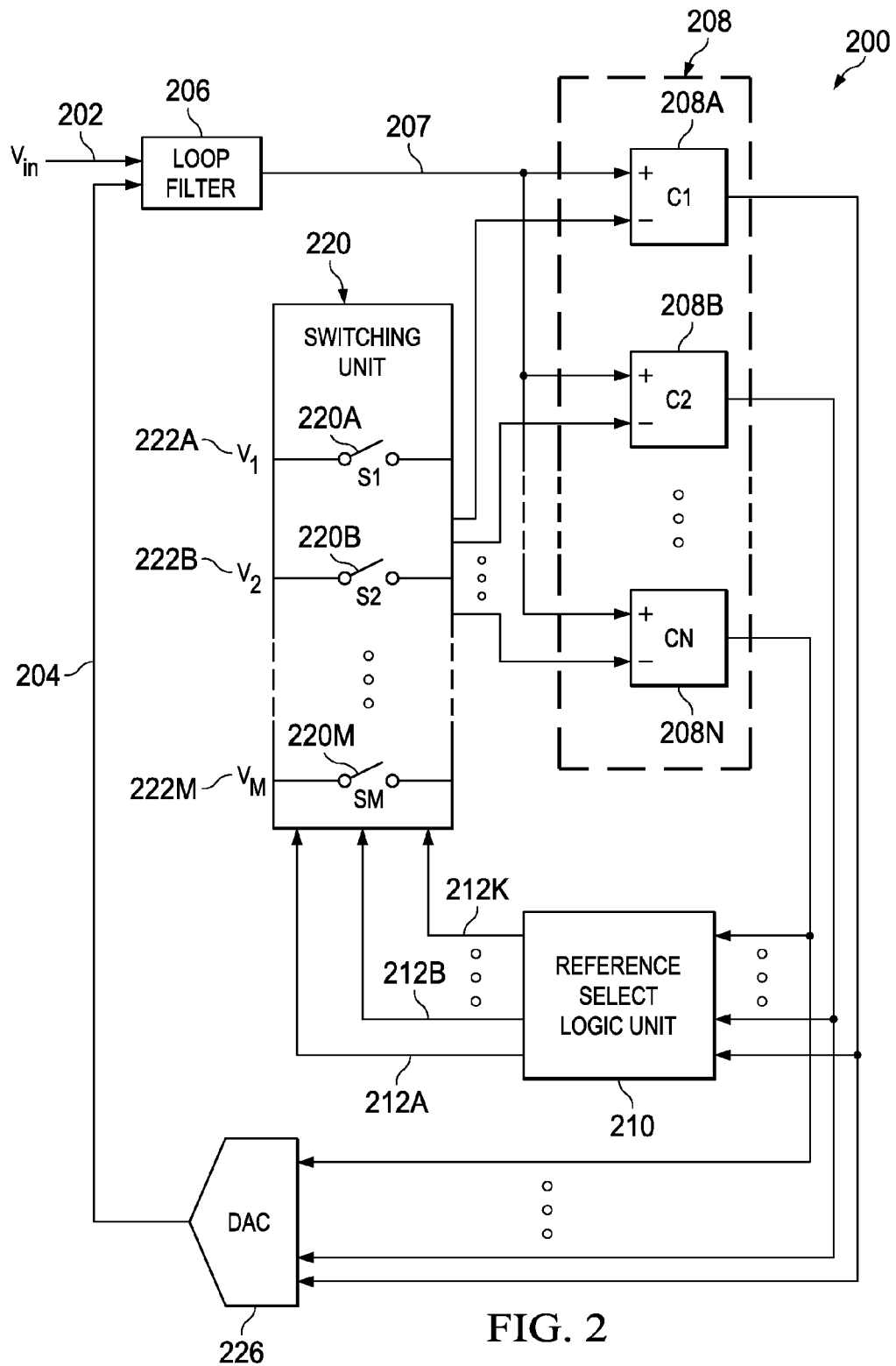
FIG. 2 illustrates architecture of a Delta Sigma modulator, according to an embodiment.

FIG. 2 illustrates architecture of a delta sigma modulator 200, according to an embodiment. The delta sigma modulator 200 includes a loop filter 206 that receives an analog input signal ($V_{in}$) 202 and a first analog signal 204. The first analog signal 204 is an output of a digital to analog converter 226. In one embodiment, the loop filter 206 receives a plurality of first analog signals from a plurality of digital to analog converters. In an embodiment, the loop filter 206 includes one or more integrators coupled to one or more summation devices and at least one summation device of the one or more summation devices receives a first analog signal from a digital to analog converter of the plurality of digital to analog converters. In another embodiment, the loop filter 206 includes one or more resonators coupled to one or more summation devices and at least one summation device of the one or more summation devices receives a first analog signal from a digital to analog converter of the plurality of digital to analog converters. An output of the loop filter 206 is a first output signal 207. The first output signal 207 is provided to the plurality of comparators 208, for example comparator C1 208A, C2 208B and CN 208N. Each comparator of the plurality of comparators 208 generates a digital output signal. The digital output signal from each comparator is provided to a reference select logic unit 210 as a feedback. In one embodiment, a data bus couples the plurality of comparators 208 and the reference select logic unit 210. The data bus provides the digital output signal from each comparator to the reference select logic unit 210. The reference select logic unit 210 generates a plurality of switching signals such as switching signals 212A, 212B and 212K. The delta sigma modulator 200 includes a switching unit 220 coupled to the plurality of comparators 208. The switching unit 220 includes a plurality of switches for example switch S1 220A, S2 220B and SM 220M. The switching unit receives a plurality of pre-computed reference voltages for example V1 222A, V2 222B, and VM 222M. Each switch in the switching unit 220 is configured to receive a pre-computed reference voltage for example switch S1 220A receives pre-computed reference voltage V1 222A, switch S2 220B receives pre-computed reference voltage V2 222B and switch SM 220M receives pre-computed reference voltage VM 222M. The switching unit 220 receives the plurality of switching signals 212A, 212B and 212K from the reference select logic unit 210. The digital to analog converter 226 receives the digital output signal from each comparator as a feedback signal and generates the first analog signal 204. The delta sigma modulator 200 may include one or more additional components known to those skilled in the relevant art and are not discussed here for simplicity of the description.

The operation of the delta sigma modulator 200 illustrated in FIG. 2 is explained now. The analog input signal ($V_{in}$) 202 is a voltage signal. In some embodiments, the analog input signal ($V_{in}$) 202 is either a current signal or a charge signal. In some embodiments, the analog input signal ($V_{in}$) 202 is at least one of a single ended signal and a differential signal. The loop filter 206 process the analog input signal ($V_{in}$) 202 and the first analog signal 204. The processing by loop filter 206 includes the following, but not limited to, comparing, subtracting, amplifying, and filtering the input signals. The loop filter 206 generates the first output signal 207. Each comparator of the plurality of comparators 208 compares the first output signal 207 and a pre-computed reference voltage of the plurality of pre-computed reference voltages V1, V2 and VM received through the switching unit 220. Each comparator receives a different pre-computed reference voltage from the switching unit 220. In one embodiment, one or more comparators receive same pre-computed reference voltage from the switching unit 220. Each comparator of the plurality of comparators 208 generates a digital output signal. The digital output signal from each comparator is provided to a reference select logic unit 210 as a feedback.

The reference select logic unit 210 is one of the following, but not limited to, a logic-gate combination unit, a flip-flop unit, and a multiplexer unit. Based on the digital output signal from the plurality of comparators 208, the reference select logic unit 210 generates a plurality of switching signals 212A, 212B and 212K. The switching signals 212A, 212B and 212K activate a plurality of switches such as switch S1 220A, S2 220B and SM 220M in the switching unit 220 in response to the digital output signals received from the plurality of comparators 208. A pre-computed reference voltage is provided to each comparator. For example, the switch S1 220A is activated by the switching signal 212A and the pre-computed reference voltage V1 222A is provided to the comparator C1

208A. In one embodiment, multiple switches are activated by a switching signal and the pre-computed reference voltages at the multiple switches are provided to the plurality of comparators 208. For example, switching signal 212A activates S1 220A and S2 220B. The pre-computed reference voltage V1 222A is provided to the comparator C1 208A and pre-computed reference voltage V2 222B is provided to the comparator CN 208N.

The plurality of pre-computed reference voltages V1, V2 and VM are calculated in the delta sigma modulator 200 such that a sampling frequency of the delta sigma modulator 200 is increased, leading to a correspondingly higher oversampling ratio (OSR) and a significantly higher resolution. The reference select logic unit 210 and the switching unit 220 provide fast feedback to the plurality of comparators 208 and hence this path is termed as direct path. The direct path results in higher sampling frequency of the delta sigma modulator 200 as pre-computed reference voltages are used instead of computing the reference values in real time. The functioning of the delta sigma modulator is further illustrated in FIG. 3A using 3 comparators.

Figure 3A:
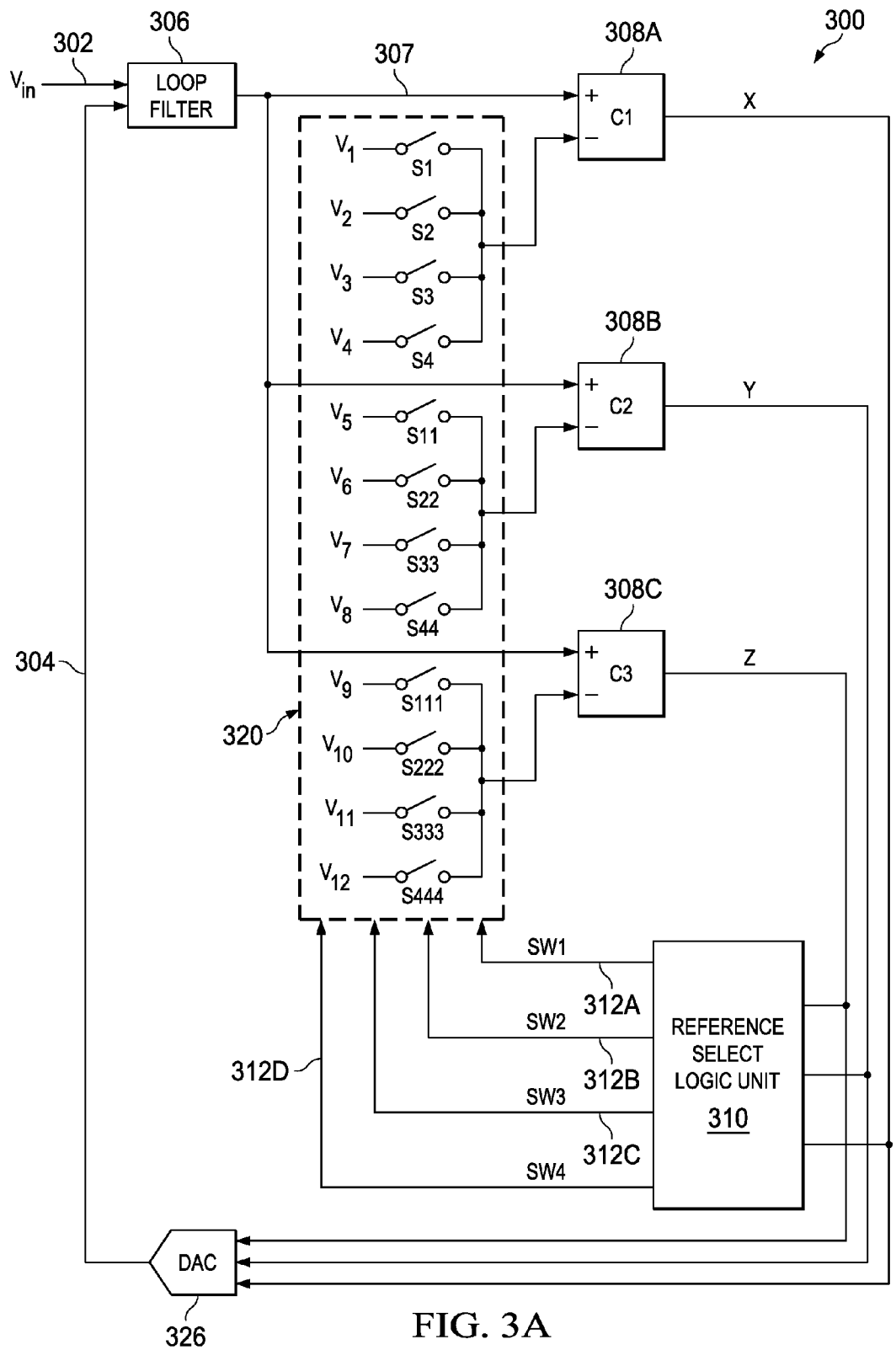
FIG. 3A illustrates architecture of a Delta Sigma modulator, according to an embodiment.

FIG. 3A illustrates architecture of a delta sigma modulator 300, according to an embodiment. The delta sigma modulator 300 is one of the many ways of implementing delta sigma modulator 200. The delta sigma modulator 300 includes a loop filter 306 that receives an analog input signal ($V_{in}$) 302 and a first analog signal 304. The first analog signal 304 is an output of a digital to analog converter 326. In one embodiment, the loop filter 306 receives a plurality of first analog signals from a plurality of digital to analog converters. In an embodiment, the loop filter 306 includes one or more integrators coupled to one or more summation devices and at least one summation device of the one or more summation devices receives a first analog signal from a digital to analog converter of the plurality of digital to analog converters. In another embodiment, the loop filter 306 includes one or more resonators coupled to one or more summation devices and at least one summation device of the one or more summation devices receives a first analog signal from a digital to analog converter of the plurality of digital to analog converters. An output of the loop filter 306 is a first output signal 307. The first output signal 307 is provided to the comparators C1 308A, C2 308B and C3 308C. The comparator C1 308A generates a digital output signal X. The comparator C2 308B generates a digital output signal Y. The comparator C3 308C generates a digital output signal Z. The digital output signals X, Y and Z are provided to a reference select logic unit 310 as a feedback. The reference select logic unit 310 generates switching signals 312A, 312B, 312C and 312D. The delta sigma modulator 300 includes a switching unit 320 coupled to the comparators C1 308A, C2 308B and C3 308C. The switching unit 320 includes a plurality of switches for example switch S1, S2, S3, S4, S11, S22, S33, S44, S111, S222, S333 and S444. The comparator C1 is coupled to the switches S1, S2, S3, and S4. The comparator C2 is coupled to the switches S11, S22, S33, and S44. The comparator C3 is coupled to the switches s111, S222, S333 and S444. The switching unit 320 receives a plurality of pre-computed reference voltages for example V1-V12. Each switch in the switching unit 320 is configured to receive a pre-computed reference voltage for example switch 51 receives pre-computed reference voltage V1, switch S2 receives pre-computed reference voltage V2. The switching unit 320 receives the switching signals 312A, 312B, 312C and 312D from the reference select logic unit 310. The digital to analog converter 326 receives the digital output signals X, Y and Z as feedback signals and generates the first analog signal 304. The delta sigma modulator 300 may include one or more additional components known to those skilled in the relevant art and are not discussed here for simplicity of the description.

The operation of the delta sigma modulator 300 illustrated in FIG. 3 is explained now. The analog input signal ($V_{in}$) 302 is a voltage signal. In some embodiments, the analog input signal ($V_{in}$) 302 is either a current signal or a charge signal. In some embodiments, the analog input signal ($V_{in}$) 302 is at least one of a single ended signal and a differential signal. The loop filter 306 process the analog input signal ($V_{in}$) 303 and the first analog signal 304. The processing by loop filter 306 includes the following, but not limited to, comparing, subtracting, amplifying, and filtering the input signals. The loop filter 306 generates the first output signal 307. The comparators C1 308A, C2 308B and C3 308C receive the first output signal 307. Each comparator also receives a pre-computed reference voltage from the switching unit 320. For example, the comparator C1 308A receives one of the pre-computed reference voltage V1, V2. V3 and V4 based on the switching signals from the reference select logic unit 310. The plurality of pre-computed reference voltages V1-V12 are pre-computed in the system i.e. the pre-computed reference voltages are fixed in the delta sigma modulator 300 and are not computed in real time. The reference select logic unit 310 activates a set of switches in response to the digital output signals X, Y, Z and the pre-computed reference voltages are provided to the comparators. The functioning of the delta sigma modulator 300 is further illustrated in the following paragraph using numerical values of each parameter.

Consider an example, when the first output signal 307 varies from −1 to +1. A default reference voltage of the comparators may be +0.5, 0 and −0.5 to maintain the first output signal 307 in the range of −1 to +1. The comparator C1 is assigned a default reference voltage of +0.5, the comparator C2 is assigned a default reference voltage of 0 and the comparator C3 is assigned a default reference voltage of −0.5. The pre-computed reference voltage for a comparator is computed using the following:

$$V_{ref}=\text{Default reference voltage}+K_o*\text{Analog Equivalent of } X+Y+Z$$

Where $K_o$ is multiplication factor. The multiplication factor is predefined for a sigma delta modulator.

The analog equivalent of X+Y+Z is given in Table 1 for different values of X, Y, and Z.

TABLE 1

| X | Y | Z | X + Y + Z | Analog Equivalent of X + Y + Z |
|---|---|---|-----------|-------------------------------|
| 0 | 0 | 0 | 00 | −0.75 |
| 1 | 0 | 0 | 01 | −0.25 |
| 1 | 1 | 0 | 10 | 0.25 |
| 1 | 1 | 1 | 11 | 0.75 |

If value of $K_o$ is 0.1 and value of X, Y and Z are 0, the value of pre-computed reference voltage V1 is $$V1=0.5+0.1*-0.75=0.425$$

The default reference voltage for comparator C1 is 0.5 and analog equivalent of X+Y+Z is −0.75.

The following table (Table 2) provides the value of pre-computed reference voltages provided to the comparators for different values of X, Y, Z and when $K_o$ is 0.1

TABLE 2

| Ko | X | Y | Z | X + Y + Z | Switching Line Selected | Switches Selected by the Switching Line | Reference voltage provided to Comparator C1 | Reference voltage provided to Comparator C2 | Reference voltage provided to Comparator C3 |
|---|---|---|---|---|---|---|---|---|---|
| 0.1 | 0 | 0 | 0 | 00 | SW1 | S1, S11, S111 | V1 = 0.425 | V5 = −0.075 | V9 = −0.575 |
| | 1 | 0 | 0 | 01 | SW2 | S2, S22, S222 | V2 = 0.475 | V6 = −0.025 | V10 = −0.525 |
| | 1 | 1 | 0 | 10 | SW3 | S3, S33, S333 | V3 = 0.525 | V7 = 0.025 | V11 = −0.475 |
| | 1 | 1 | 1 | 11 | SW4 | S4, S44, S444 | V4 = 0.575 | V8 = 0.075 | V12 = −0.425 |

Table 2 illustrates the switching lines selected for different values of X, Y, Z and the corresponding switches selected by the switching lines. For example, when X, Y, Z are 0, switching line SW1 is activated. The switching line SW1 activates switches S1, S11 and S111. Thus, the pre-computed reference voltage V1=0.425 is provided to the comparator C1, the pre-computed reference voltage V5=−0.075 is provided to the comparator C2 and the pre-computed reference voltage V9=−0.575 is provided to the comparator C3. The above example provides one of the many ways of calculating the pre-computed reference voltages. Also, the combination of switching unit 320 and reference select logic unit 310 is one of the many ways of providing the pre-computed reference voltages to the comparators. It should be noted, however, that the scope of the present technology is not limited to any or all of the embodiments disclosed herein. Indeed, one or more of the devices, features, operations, processes, characteristics, or other qualities of a disclosed embodiment may be removed, replaced, supplemented, or changed.

In the above example, lesser number of switches is required when value of $K_o$ is an integer. When $K_o$ is integer, the value of pre-computed reference voltages overlap. This is further illustrated in the following Table 3.

TABLE 3

| Ko | X | Y | Z | X + Y + Z | Switching Line Selected | Switches Selected by the Switching Line | Reference voltage provided to Comparator C1 | Reference voltage provided to Comparator C2 | Reference voltage provided to Comparator C3 |
|---|---|---|---|---|---|---|---|---|---|
| 1 | 0 | 0 | 0 | 00 | SW1 | S1, S11, S111 | V1 = −1.25 | V5 = −0.75 | V9 = −0.25 |
| | 1 | 0 | 0 | 01 | SW2 | S2, S22, S222 | V2 = −0.75 | V6 = −0.25 | V10 = 0.25 |
| | 1 | 1 | 0 | 10 | SW3 | S3, S33, S333 | V3 = −0.25 | V7 = 0.25 | V11 = 0.75 |
| | 1 | 1 | 1 | 11 | SW4 | S4, S44, S444 | V4 = 0.25 | V8 = 0.75 | V12 = 1.25 |

As illustrated in the above table, when $K_o$=1, the values of pre-computed reference voltages overlap for example V3=V6=V9 and V4=V7=V10. Thus a single switch (for example S3) can be used to provide pre-computed reference voltage of −0.25. The optimized table with lesser number of switches when value of $K_o$ is 1 is given below:

TABLE 4

| Ko | X | Y | Z | X + Y + Z | Switching Line Selected | Switches Selected by the Switching Line | Reference voltage provided to Comparator C1 | Reference voltage provided to Comparator C2 | Reference voltage provided to Comparator C3 |
|---|---|---|---|---|---|---|---|---|---|
| 1 | 0 | 0 | 0 | 00 | SW1, SW3, SW5 | S1, S11, S111 | V1 = −1.25 | V3 = −0.75 | V5 = −0.25 |
| | Any one of X, Y, Z is 1 | | | 01 | SW2, SW3, SW5 | S2, S11, S111 | V2 = 0.25 | V3 = −0.75 | V5 = −0.25 |
| | Any Two of X, Y, Z is 1 | | | 10 | SW2, SW4, SW5 | S2, S22, S111 | V2 = 0.25 | V4 = 0.75 | V5 = −0.25 |
| | 1 | 1 | 1 | 11 | SW2, SW4, SW6 | S2, S22, S222 | V2 = 0.25 | V4 = 0.75 | V6 = 1.25 |

Figure 3B:
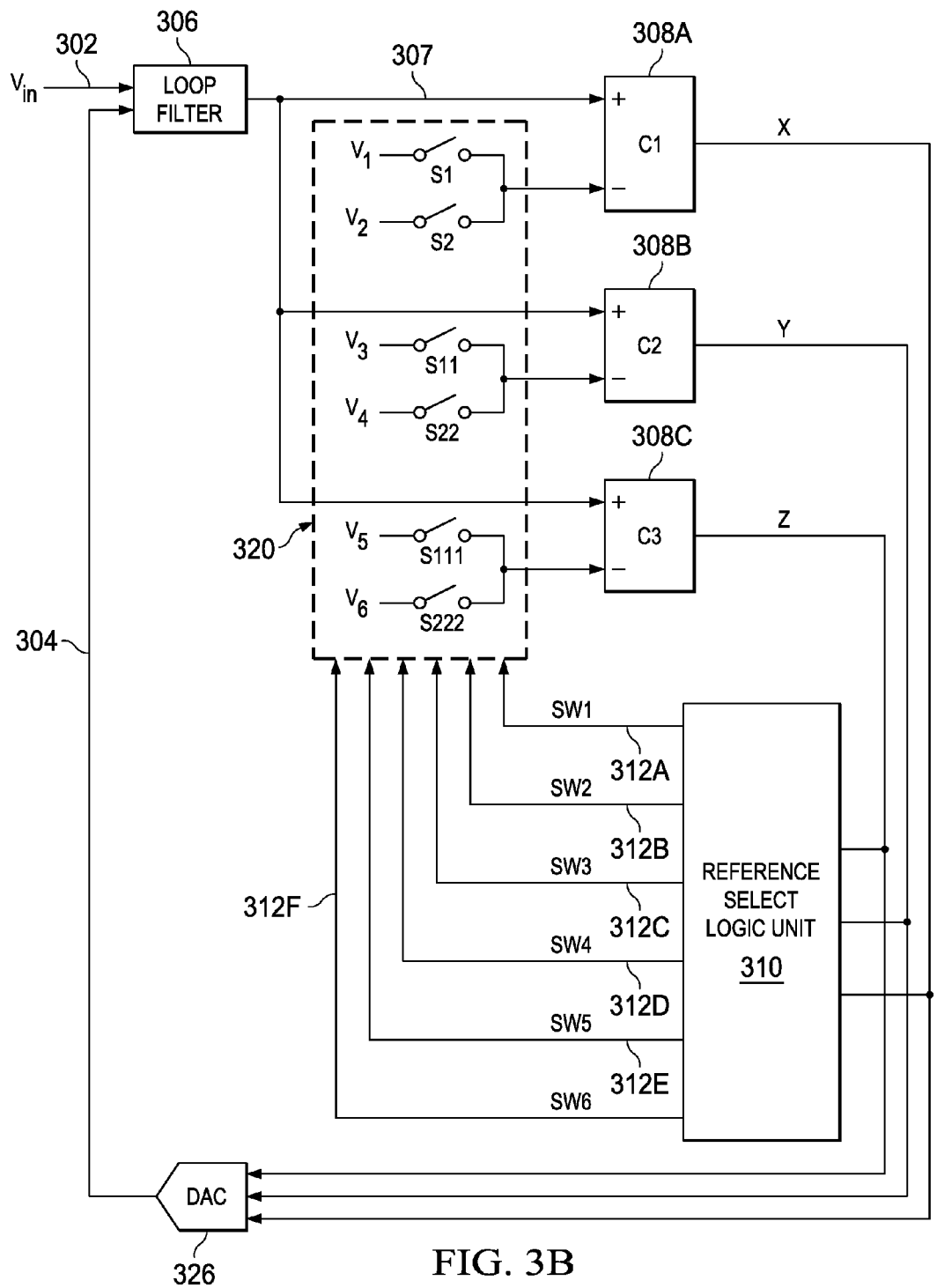
FIG. 3B illustrates architecture of a Delta Sigma modulator, according to an embodiment.

The above table (Table 4) is illustrated in FIG. 3B. In this implementation, only six switches are required. For example, in a case when one of X or Y or Z is 1, switching lines SW2, SW3 and SW5 are activated. The switching line SW2 activates switch S2, the switching line SW3 activates switch S11 and the switching line SW5 activates switch S111. Thus, the pre-computed reference voltage V2=0.25 is provided to the comparator C1, the pre-computed reference voltage V3=−0.75 is provided to the comparator C2 and the pre-computed reference voltage V5=−0.25 is provided to the comparator C3. The required number of switches is further reduced by use of a voltage shifter network as illustrated in FIG. 4.

The plurality of pre-computed reference voltages V1-V4 are calculated and stored in the delta sigma modulator 300. In one embodiment, the pre-computed reference voltages are fed to the delta sigma modulator 300 when the system comprising the delta sigma modulator 300 is initiated or reset. The values of pre-computed reference voltages is such that a sampling frequency of the delta sigma modulator 300 is increased, leading to a correspondingly higher oversampling ratio (OSR) and a significantly higher resolution. The reference select logic unit 310 and the switching unit 320 provide fast feedback to the plurality of comparators and hence this path is termed as direct path. The direct path results in higher sampling frequency of the delta sigma modulator 300 as pre-computed reference voltages are used and the reference voltages are not calculated in real time.

Figure 4:
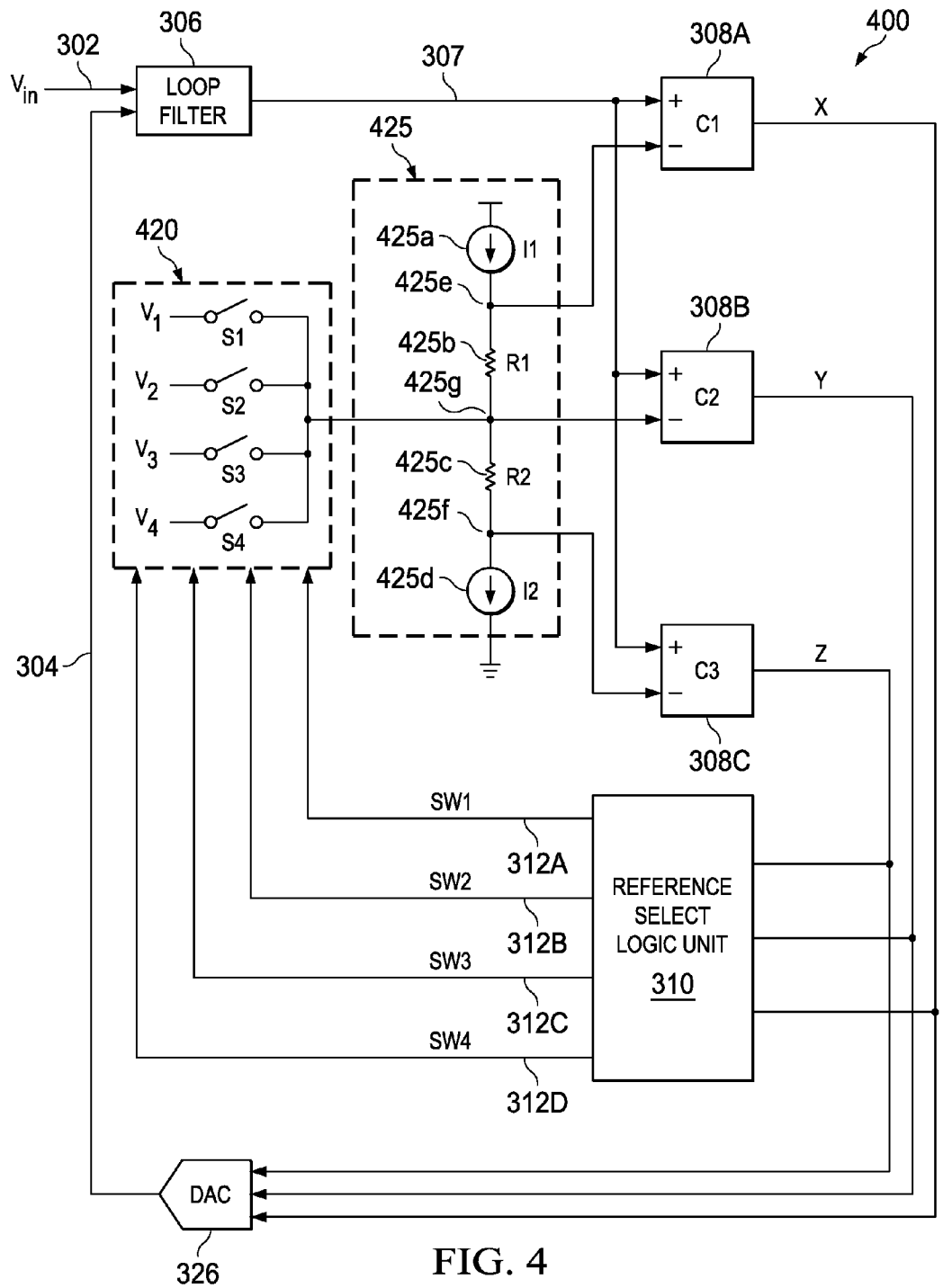
FIG. 4 illustrates architecture of a Delta Sigma modulator, according to an embodiment.

FIG. 4 illustrates architecture of a delta sigma modulator 400, according to an embodiment. Those components of FIG. 4, which have identical reference numerals as those of FIG. 3 have same or similar functionalities and are therefore not explained again for brevity reasons. The delta sigma modulator 400 includes a switching unit 420 coupled to a voltage shifter network 425. The voltage shifter network 425 is coupled to the comparators C1 308A, C2 308B and C3 308C. The voltage shifter network 425 includes two current sources I1 425a, I2 425d and two resistors R1 425b and R2 425c. The comparator C1 is coupled between the current source I1 425a and R1 425b at 425e. The comparator C2 is coupled between the resistor R1 425b and resistor R2 425c at 425g. The comparator C3 is coupled between the resistor R2 425c and current source I2 425d at 425f. The switching unit 420 is coupled between the resistor R1 425b and resistor R2 425c at 425g.

The switching unit 420 includes a plurality of switches for example switch S1, S2, S3, and S4. The switching unit receives a plurality of pre-computed reference voltages for example V1-V4. Each switch in the switching unit 420 is configured to receive a pre-computed reference voltage for example switch S1 receives pre-computed reference voltage V1, switch S2 receives pre-computed reference voltage V2. The switching unit 420 receives the switching signals 312A, 312B, 312C and 312D from the reference select logic unit 310.

The functioning of the delta sigma modulator 400 is illustrated using numerical values of each parameter. In the case when the pre-computed reference voltages are given as V1=−0.075 volt, V2=−0.025 volt, V3=+0.025 volt and V4=+0.075 volt. The current sources I1 and I2 generate 1 mA current while resistor R1 and R2 each equals 500 ohms. The voltage generated at 425e is 0.5 volt and at 425f is −0.5 volt. Therefore, when X, Y, Z are all 0, X+Y+Z will be 0. Switching line SW1 is selected and the switch S1 is activated by the switching line SW1. Thus, a voltage V1=−0.075 is available at the voltage shifter network 425 at 425g. This voltage V1=−0.075 is passed to the comparator C2 308B. The voltage generated at 425e is 0.425 (−0.075+0.5) which is passed to comparator C1 308A. Similarly, the voltage generated at 425f is −0.575 (0.075 −0.5) which is passed to comparator C3 308C. The following table (Table 4) provides the value of pre-computed reference voltages provided to the comparators for different values of X, Y, Z and when V1=−0.075 volt, V2=−0.025 volt, V3=+0.025 volt and V4=+0.075 volt. Also, current sources I1 and I2 generate 1 mA current while resistor R1 and R2 each equals 500 ohms.

| X | Y | Z | X+Y+Z | Switching Line Selected | Switches Selected by the Switching Line | Reference voltage provided to Comparator C1 | Reference voltage provided to Comparator C2 | Reference voltage provided to Comparator C3 |
|---|---|---|---|---|---|---|---|---|
| 0 | 0 | 0 | 00 | SW1 | S1 | 0.425 | −0.075 | −0.575 |
| 1 | 0 | 0 | 01 | SW2 | S2 | 0.475 | −0.025 | −0.525 |
| 1 | 1 | 0 | 10 | SW3 | S3 | 0.525 | 0.025 | −0.475 |
| 1 | 1 | 1 | 11 | SW4 | S4 | 0.575 | 0.075 | −0.425 |

Thus, the required number of switches is reduced to 4. The plurality of pre-computed reference voltages V1-V4 are calculated and stored in the delta sigma modulator 400. In one embodiment, the pre-computed reference voltages are fed to the delta sigma modulator 400 when the system comprising the delta sigma modulator 400 is initiated or reset. The values of pre-computed reference voltages is such that a sampling frequency of the delta sigma modulator 400 is increased, leading to a correspondingly higher oversampling ratio (OSR) and a significantly higher resolution. The reference select logic unit 310 and the switching unit 420 provide fast feedback to the plurality of comparators and hence this path is termed as direct path. The direct path results in higher sampling frequency of the delta sigma modulator 400 as pre-computed reference voltages are used and the reference voltages are not calculated in real time.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. A delta sigma modulator comprising:
   a loop filter configured to receive an analog input signal and an output of a digital to analog converter;
   a comparator configured to receive an output of the loop filter and to generate a digital output signal;
   a reference select logic unit configured to receive the digital output signal as a feedback and configured to generate one or more switching signals; and
   one or more switches coupled to the comparator, each switch of the one or more switches configured to receive a pre-computed reference voltage, wherein the one or more switches are configured to be activated by the one or more switching signals in response to the digital output signal, and wherein the pre-computed reference voltage is calculated from a multiplication factor.

2. The delta sigma modulator of claim 1, wherein the analog input signal is at least one of a voltage signal, a current signal, and a charge signal.

3. The delta sigma modulator of claim 2, wherein the voltage signal, current signal and charge signal is at least one of single ended signal and a differential signal.

4. The delta sigma modulator of claim 1, wherein a switch of the one or more switches is configured to be activated to provide the pre-computed reference voltage to the comparator such that a sampling frequency of the delta sigma modulator is increased.

5. The delta sigma modulator of claim 1, wherein the reference select logic unit is one of a logic-gate combination unit, a flip-flop unit, and a multiplexer unit.

6. The delta sigma modulator of claim 1, wherein the digital to analog converter is configured to receive the digital output signal as a feedback signal.

7. A delta sigma modulator comprising:
   a loop filter configured to receive an analog input signal and an output of a digital to analog converter;
   a plurality of comparators configured to receive an output of the loop filter, each comparator of the plurality of comparators configured to generate a digital output signal,
   a reference select logic unit configured to receive the digital output signal from each comparator as a feedback and configured to generate a plurality of switching signals; and
   a switching unit coupled to the plurality of comparators and configured to receive a plurality of pre-computed reference voltages, the switching unit comprising a plurality of switches configured to be activated by the one or more switching signals in response to the digital output signal from each comparator, wherein each switch of the plurality of switches is configured to receive a pre-computed reference voltage of the plurality of pre-computed reference voltages.

8. The delta sigma modulator of claim 7 further comprising a data bus coupling the plurality of comparators and the reference select logic unit.

9. The delta sigma modulator of claim 7, wherein the analog input signal is at least one of voltage signal, a current signal, and a charge signal.

10. The delta sigma modulator of claim 9, wherein the voltage signal, current signal and charge signal is at least one of single ended signal and a differential signal.

11. The delta sigma modulator of claim 7, wherein a pre-computed reference voltage of the plurality of pre-computed reference voltages is calculated from at least one of a default reference voltage of the comparator, a multiplication factor and the digital output signal.

12. The delta sigma modulator of claim 7, wherein the reference select logic unit is one of a logic-gate combination unit, a flip-flop unit, and a multiplexer unit.

13. The delta sigma modulator of claim 7, wherein the digital to analog converter is configured to receive the digital output signal from each comparator of the plurality of comparators as a feedback signal.

14. The delta sigma modulator of claim 7 further comprising N comparators and the reference select logic unit is configured to generate 2N switching signals, wherein N is an integer.

15. The delta sigma modulator of claim 14, wherein the switching unit comprises 2N switches configured to be activated by the one or more of the 2N switching signals in response to the digital output signal from each comparator, wherein each comparator is coupled to two switches and each switch of the 2N switches is configured to receive the pre-computed reference voltage.

16. A method of generating a digital output signal in a delta sigma modulator responsive to an analog input signal, comprising:
processing a first analog signal and the analog input signal to generate a first output signal;
comparing the first output signal and a pre-computed reference voltage to generate a digital output signal; and
selecting the pre-computed reference voltage of a plurality of pre-computed reference voltages responsive to the digital output signal, wherein the pre-computed reference voltage is calculated from a multiplication factor.

17. The method of claim 16 further comprising generating the first analog signal from the digital output signal.

18. The method of claim 16, wherein selecting the pre-computed reference voltage responsive to the digital output signal comprises providing the digital output signal as a feedback to a reference select logic unit, wherein the reference select logic unit selects a pre-computed reference voltage of the plurality of pre-computed reference voltages such that a sampling frequency of the delta sigma modulator is increased.

19. A delta sigma modulator comprising:
a loop filter configured to receive an analog input signal and an output of a digital to analog converter;
a plurality of comparators configured to receive an output of the loop filter, each comparator of the plurality of comparators configured to generate a digital output signal,
a reference select logic unit configured to receive the digital output signal from each comparator as a feedback and configured to generate a plurality of switching signals;
a switching unit coupled to the reference select logic unit and configured to receive a plurality of pre-computed reference voltages, the switching unit comprising a plurality of switches configured to be activated by the one or more switching signals in response to the digital output signal from each comparator, wherein each switch of the plurality of switches is configured to receive a pre-computed reference voltage of the plurality of pre-computed reference voltages; and
a voltage shifter network coupled to the plurality of comparators and configured to provide a voltage shift to the pre-computed reference voltage generated by the switching unit.

20. The delta sigma modulator of claim 19, wherein the voltage shifter network includes a set of resistors coupled between a set of current sources.

21. The delta sigma modulator of claim 19 further comprising N comparators and the reference select logic unit is configured to generate N+1 switching signals, wherein N is an integer.

22. The delta sigma modulator of claim 19, wherein the switching unit comprises N+1 switches configured to be activated by the one or more of the N+1 switching signals in response to the digital output signal from each comparator.

* * * * *